(12) United States Patent
Kurata

(10) Patent No.: US 7,326,638 B2
(45) Date of Patent: Feb. 5, 2008

(54) METHOD FOR MANUFACTURING SEMICONDUCTOR DEVICE

(75) Inventor: Hiroyuki Kurata, Fujimino (JP)

(73) Assignee: New Japan Radio Co., Ltd., Tokyo (JP)

( * ) Notice: Subject to any disclaimer, the term of this patent is extended or adjusted under 35 U.S.C. 154(b) by 0 days.

(21) Appl. No.: 11/630,000

(22) PCT Filed: Jan. 19, 2005

(86) PCT No.: PCT/JP2005/000586

§ 371 (c)(1),
(2), (4) Date: Dec. 19, 2006

(87) PCT Pub. No.: WO2006/077630

PCT Pub. Date: Jul. 27, 2006

(65) Prior Publication Data

US 2007/0202630 A1    Aug. 30, 2007

(51) Int. Cl.
*H01L 21/44* (2006.01)
(52) U.S. Cl. ............... 438/613; 257/E21.508; 257/E23.021
(58) Field of Classification Search .......... 438/613
See application file for complete search history.

(56) References Cited

U.S. PATENT DOCUMENTS 7,049,229 B2 * 5/2006 Omote et al. ............ 438/667

FOREIGN PATENT DOCUMENTS

| JP | 2001-332643 | 11/2001 |
|----|-------------|---------|
| JP | 2003-338515 | 11/2003 |
| JP | 2004-235612 | 8/2004  |

* cited by examiner

*Primary Examiner*—Steven Loke
*Assistant Examiner*—Earl Taylor
(74) *Attorney, Agent, or Firm*—Rabin & Berdo, PC

(57) ABSTRACT

An electronic circuit is formed on a semiconductor substrate and electrode pads are formed, which are formed by disposing electrode terminals of the electronic circuit through interconnections on a surface of the semiconductor substrate. After grinding a back surface of the semiconductor substrate, a first resin layer is formed on the back surface of the semiconductor substrate. Thereafter, a barrier metal layer is formed on the electrode pad by an electroless plating technique, and a solder core is formed thereon. A second resin layer is formed by printing a resin, and after exposing the solder core by grinding the second resin layer, a solder bump is formed thereon. By this method, an extra process such as masking the semiconductor substrate and subsequent removing a mask can be omitted, while forming the barrier metal layer by the electroless plating technique. And, since the first resin layer is formed at an early step of a manufacturing process, damage or fracture of the substrate in the manufacturing process can be avoided, and, furthermore, by forming the first resin layer with a resin sheet, a desired thin thickness can be surely obtained. As a result, a down sized, thinned and weight lightened semiconductor device can be obtained and cost reduction can be achieved simultaneously.

3 Claims, 6 Drawing Sheets

METHOD FOR MANUFACTURING SEMICONDUCTOR DEVICE

FIELD OF THE INVENTION

The present invention relates to a method for manufacturing a semiconductor device by which down sizing, thinning, weight lightening and cost reducing can be achieved. More particularly, the present invention relates to a method for manufacturing a semiconductor device, by which, a semiconductor device which can be mounted directly on a mother board or the like without using a lead frame or an interposer while having fine electrode terminals, can be obtained by a simple manufacturing process and with low cost.

BACKGROUND OF THE INVENTION

A semiconductor device is generally manufactured, for example as shown in FIG. 15, by die bonding a semiconductor chip 21 on a die pad 22 of a lead frame, wire bonding an electrode pad 21a to a lead 23 of the lead frame with a gold wire 24, and forming a package 25 by molding a resin.

And as a means to achieve down sizing, thinning and weight lightening, a chip size package has been employed, as shown in FIG. 16 or 17, in which the electrode pads 21a around the semiconductor chip 21 are disposed on the semiconductor chip 21, thereafter solder balls are formed. Namely, an example shown in FIG. 16 represents a technology including steps of forming interconnections (not shown in the figure) on one surface of an interposer 26 made of a ceramic substrate, an organic substrate made of polyimide or the like, a film tape or the like, connecting the electrode pad 21a of the semiconductor chip 21 to the above-described interconnection by wire bonding using the gold wire 24 or the like, forming external electrodes 27, on a back surface of the interposer 26, made of solder balls or the like connected to each of the interconnections and coating a side of the semiconductor chip 21 with a resin 25. And, an example shown in FIG. 17 is formed by connecting the electrode pad 21a of the semiconductor chip 21 to the interconnection not by wire bonding, but by connecting directly a solder bump 21b to the interconnection of the interposer 26 after forming the solder bump 21b on the electrode pad (not shown in the figure). The other structures are the same as that in the example shown in FIG. 16. Reference number 28 represents a resin layer with which the semiconductor chip is fixed.

Since electrode pads formed around a semiconductor chip with very small spacing are disposed to an entire area of the semiconductor chip by using an interposer explained above, the semiconductor chip can be connected directly to the circuit board. For example, being accompanied with a promotion of high integration and down sizing of semiconductor chips, the electrode pads are located around the semiconductor chip with a spacing of approximately 100 to 200 μm. On the contrary, since interconnections of a circuit board, on which the semiconductor chip is mounted, have a spacing of approximately 0.5 mm, the semiconductor chip can not be connected to the circuit board directly even if bump electrodes are formed on the electrode pads of the semiconductor chip. But by using the interposer, as electrodes can be disposed in the entire interposer, the semiconductor chip can be mounted directly to the circuit board.

Although down sizing becomes possible by using a chip size package as described above, the interposer and a process of connecting to it is necessary. The semiconductor device by using the interposer is generally more expensive compared to that by using a lead frame, because an amount of distribution, that is, an amount of production is small, or fine fabrication is occasionally demanded. Further, wire bonding between the interposer and the semiconductor chip is performed not in a lump but one by one, and, although plated bumps by a general electroplating technique can be formed in a lump, expensive equipments are indispensable like a stepper apparatus, and apparatuses for photoresist coating, photoresist developing, lithography and so on in a process of forming barrier metals. Therefore, there exists a problem such that the chip size package is expensive, even though down sizing, thinning and weight lightening can be achieved.

On the other hand, in order to solve the problem described above, the present inventor disclosed a method for manufacturing a down sized and thinned semiconductor device which included processes of relocating electrode pads on a semiconductor substrate, on which an electronic circuit is formed, by interconnection so as to be disposed in an area of an entire surface of a semiconductor chip, forming a barrier metal layer on the electrode pad by an electroless plating technique, forming a solder core thereon, exposing the solder core by grinding a resin layer after forming the resin layer on an entire surface, forming a solder bump on the exposed solder core, and forming a resin layer on the back surface of the semiconductor substrate, after thinning the semiconductor substrate by grinding a back surface of the semiconductor substrate (cf. PATENT DOCUMENT 1).

PATENT DOCUMENT 1: Japanese Patent Application Laid-Open No. 2003-338515

DISCLOSURE OF THE INVENTION

Problem to be Solved by the Present Invention

While using the method described above, there occurs a problem that a thickness of the resin layer of the back surface varies in a range of approximately several tens of micron-meters and can not always be thinned to a desired thickness in case that the resin layer of the back surface is formed by coating by a printing technique and by curing. Although, in a process of forming the barrier metal layer, by the above-described electroless plating the barrier metal layer can be formed with avoiding waste of metal material and easily, compared to that by a vacuum evaporation or a sputtering technique, it becomes necessary to stick an insulating sheet on a back surface of the semiconductor substrate, and to remove the insulating sheet after the electroless plating, since the semiconductor substrate is electrically conductive. Therefore, another problem occurs such that processes of sticking and removing the insulating sheet become complicated.

The present invention is directed to solve the above-described problems and an object of the present invention is to provide a method for manufacturing a semiconductor device by which a down sized, thinned and weight lightened semiconductor device can be obtained with a desired thin thickness surely, and cost reduction can be achieved simultaneously, while expanding a spacing between electrode pads without using an interposer, and forming a barrier metal layer by an electroless plating technique, with omitting an extra process such as masking a back surface of the semiconductor substrate for the electroless plating.

Means for Solving the Problem

A method for manufacturing a semiconductor device according to the present invention includes the steps of:

(a) forming an electronic circuit on one surface of a semiconductor substrate and forming electrode pads which are formed by disposing electrode terminals of the electronic circuit through interconnection on the surface of the semiconductor substrate; (b) grinding a back surface which is the other surface of the semiconductor substrate; (c) forming a first resin layer on the back surface of the semiconductor substrate; (d) forming a barrier metal layer on each of the electrode pads by an electroless plating technique after forming the first resin layer; (e) forming a solder core on the barrier metal layer by printing a solder paste and heating; (f) forming a second resin layer on a surface of the semiconductor substrate on which the solder core is formed; (g) exposing the solder core by grinding the second resin layer; and (h) forming a solder bump by printing a solder paste on an exposed surface of the solder core, and by applying a heat treatment.

It is preferable to form a resin layer having a thin and exact thickness that the step (c) includes the steps of sticking a resin sheet on the back surface of the semiconductor substrate, and curing the resin sheet.

Effect of the Invention

By using this method, a metal film of the barrier metal layer can be formed only on the electrode pad without plating a metal film for the barrier metal layer on the back surface of the semiconductor substrate during the process of the electroless plating, while forming the barrier metal layer by the electroless plating technique, since the semiconductor substrate is thinned by grinding the back surface of the semiconductor substrate, and the first resin layer is formed on the back surface in a former process of the electroless plating. The electroless plating can be performed without complicated process, like in an electroplating, such as forming a photoresist film on an entire metal film formed by a sputtering technique, performing the electroplating, and removing the photoresist film and etching a useless metal film thereafter. Furthermore, since the back surface of the semiconductor substrate is covered with the resin layer which is strong against a shock, damage or fracture can be prevented during transfer of a wafer or the like in a manufacturing process, although the substrate is thinned, and, at the same time, since both surfaces of the semiconductor substrate are sandwiched with resin layers, a warp of the wafer can be prevented. As a result, a high yield and a low cost of products can be achieved in a simple manufacturing process.

Furthermore, by forming the first resin layer by sticking a resin sheet and curing it by a heat treatment, the resin layer of a thin and constant thickness can be obtained and the semiconductor device having a desired and very thin thickness can be obtained as a result. In other words, in case of forming the resin layer by coating a resin by a printing technique, as a variation of its thickness is very large of approximately several tens of micron-meters, for a semiconductor device having a thickness of approximately 500 μm in total, a thickness may go over a tolerance range, even though thinning within a desired thickness is tried. But, according to the present invention, since the first resin layer is formed with a resin sheet, the first resin layer can be formed thin and with uniform thickness. As a result, the present invention remarkably contributes to manufacturing a significantly thinned semiconductor device.

EXPLANATION OF LETTERS AND NUMERALS

Figure 1:
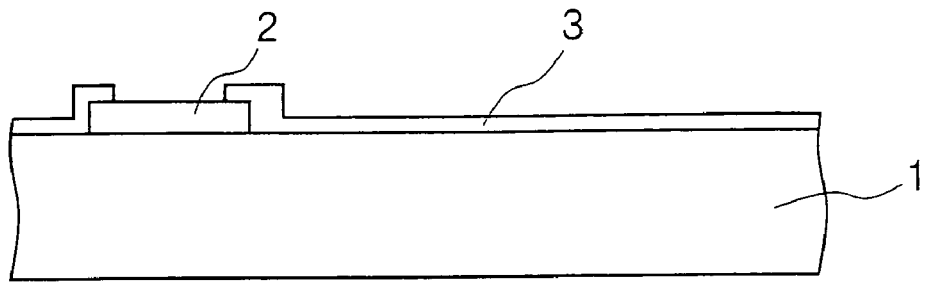
FIG. 1 is an explanatory view showing a manufacturing process of an embodiment of a manufacturing method according to the present invention.

1: semiconductor substrate
2: electrode terminal
4: interconnection
4a: electrode pad
6: first resin layer
7: barrier metal layer
8: solder core
9: second resin layer
10: solder bump

THE BEST EMBODIMENT OF THE PRESENT INVENTION

Figure 2:
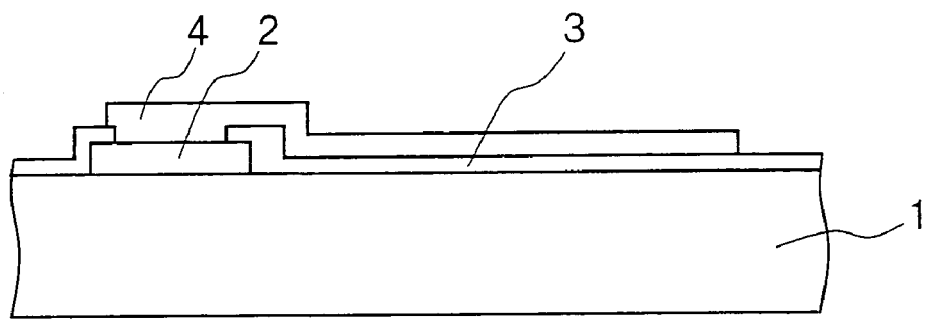
FIG. 2 is an explanatory view showing a manufacturing process of the embodiment of the manufacturing method according to the present invention.
Figure 3:
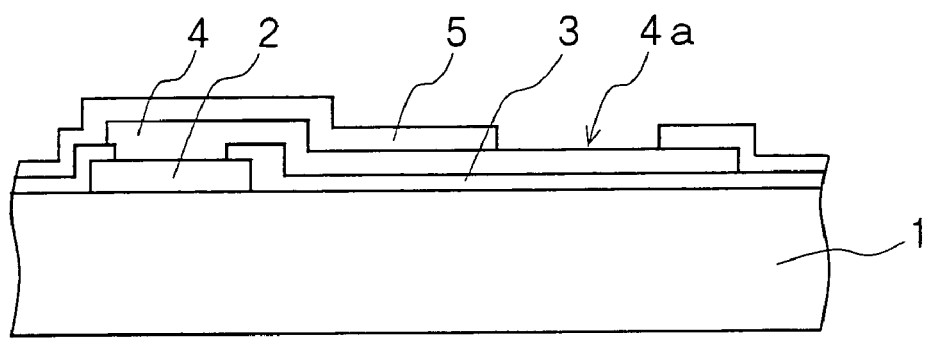
FIG. 3 is an explanatory view showing a manufacturing process of the embodiment of the manufacturing method according to the present invention.
Figure 4:
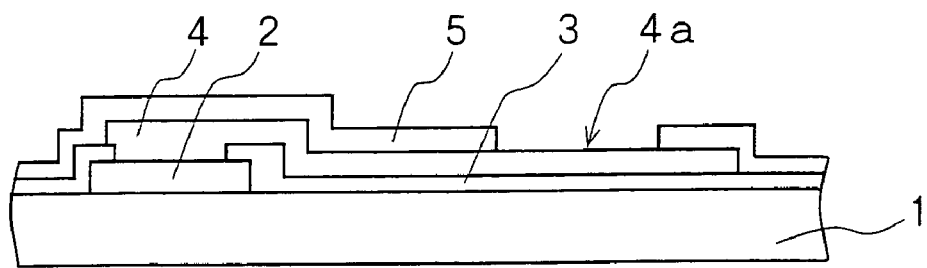
FIG. 4 is an explanatory view showing a manufacturing process of the embodiment of the manufacturing method according to the present invention.
Figure 5:
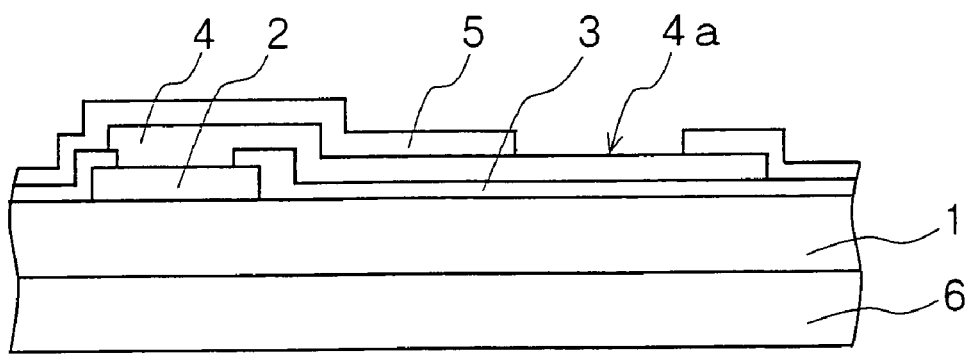
FIG. 5 are explanatory views showing a manufacturing process of the embodiment of the manufacturing method according to the present invention and showing its detailed and concrete processes.
Figure 6:
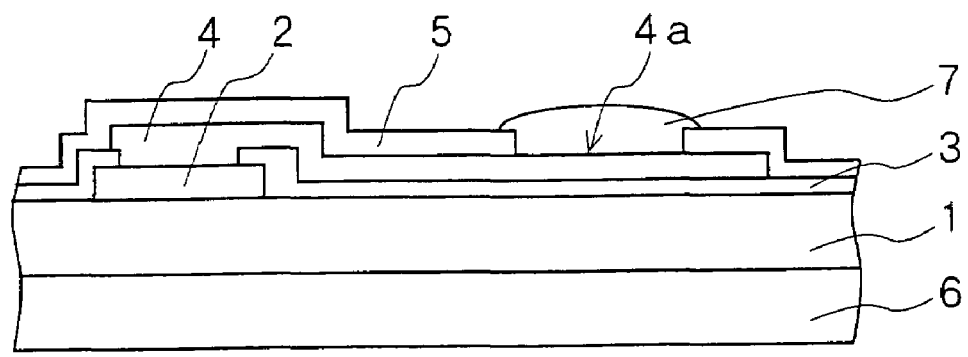
FIG. 6 is an explanatory view showing a manufacturing process of the embodiment of the manufacturing method according to the present invention.
Figure 7:
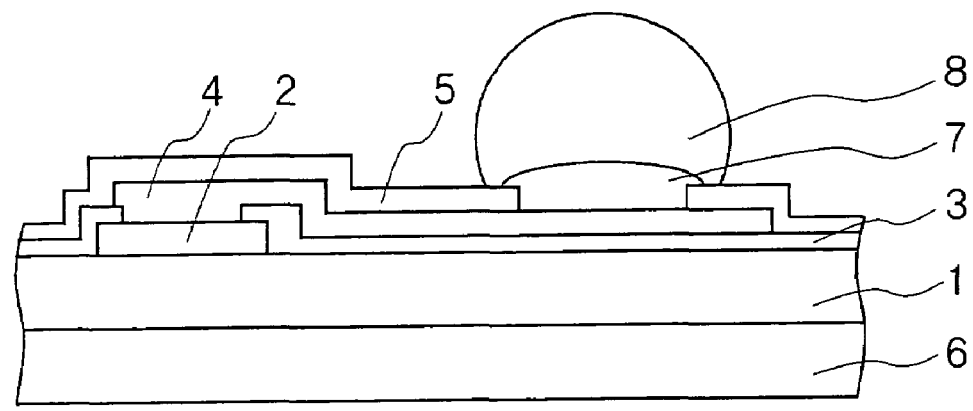
FIG. 7 is an explanatory view showing a manufacturing process of the embodiment of the manufacturing method according to the present invention.
Figure 8:
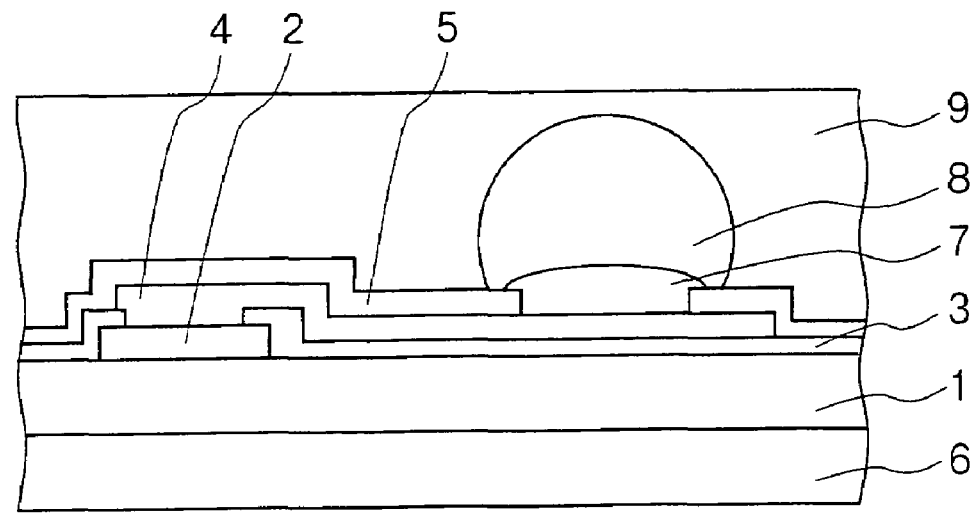
FIG. 8 is an explanatory view showing a manufacturing process of the embodiment of the manufacturing method according to the present invention.
Figure 9:
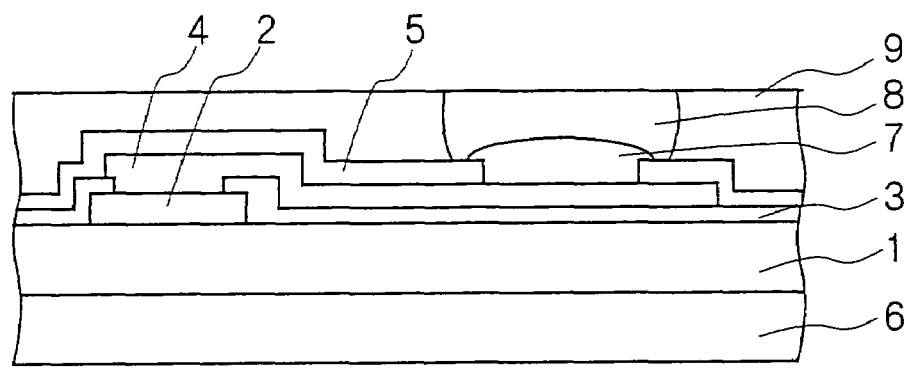
FIG. 9 is an explanatory view showing a manufacturing process of the embodiment of the manufacturing method according to the present invention.
Figure 10:
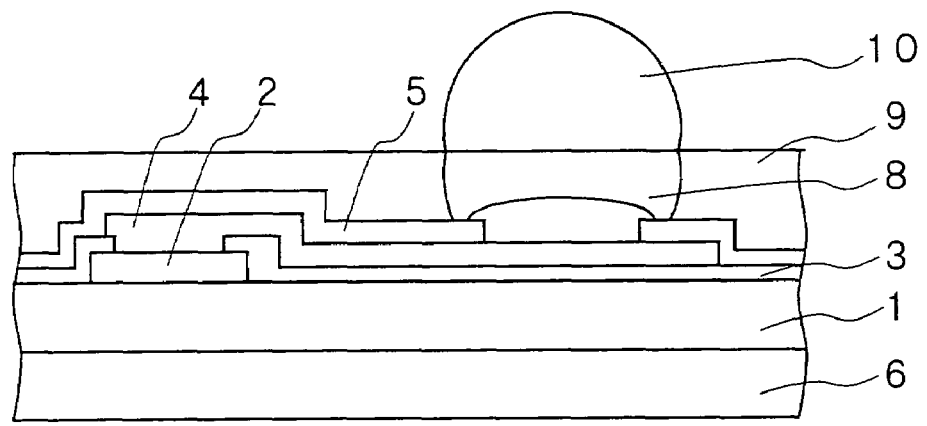
FIG. 10 is an explanatory view showing a manufacturing process of the embodiment of the manufacturing method according to the present invention.

An explanation will be given below of a method for manufacturing a semiconductor device according to the present invention in reference to the drawings. The method for manufacturing the semiconductor device according to the present invention includes the steps as follows. Firstly, as shown in FIG. 1 through 3, an electronic circuit is formed on a semiconductor substrate 1, and electrode pads 4a which are formed by disposing electrode terminals 2 of the electronic circuit through interconnections 4 are formed on the semiconductor substrate 1. Thereafter, as shown in FIG. 4, a back surface of the semiconductor substrate 1 is ground. And a first resin layer 6 is formed on the back surface of the semiconductor substrate 1 as shown in FIG. 5, a barrier metal layer 7 is formed on each of electrode pads 4a by an electroless plating technique as shown in FIG. 6. Then a solder core 8 is formed on the barrier metal layer 7 by printing a solder paste and heating as shown in FIG. 7, and a second resin layer 9 is formed on a surface of the semiconductor substrate 1 as shown in FIG. 8. Thereafter, the solder core 8 is exposed by grinding the second resin layer 9 as shown in FIG. 9, and a solder bump 10 is formed by printing a solder paste on an exposed surface of the solder core 8, and by applying a heat treatment as shown in FIG. 10.

A detailed description will be given below of the method for manufacturing the semiconductor device according to the present invention by using more concrete examples. Firstly, as shown in FIG. 1, the electronic circuit is formed by forming circuit elements (not shown in the figure) like transistors or diodes on the semiconductor substrate (wafer) 1, thereon the electrode terminal 2 of the electronic circuit is formed, and an insulating film 3 which protects the circuit elements is formed on a surface of the semiconductor substrate 1. This is a condition of a wafer before dicing into usual semiconductor chips. And, in FIG. 1 through 10, although an example composed with one electrode terminal and one bump electrode connected to the electrode terminal is shown, in case of many electrode terminals, bump electrodes can be formed onto every each of the electrode terminals in the same manner and at the same time.

And next, an interconnection 4 is formed, as shown in FIG. 2, connected to the electrode terminal 2 and extended to a desired place where the bump electrode is formed, by forming a film made of a material for an electrode like Al—Si (Si of 1 wt %) or the like and having a thickness of approximately 3 μm by a sputtering technique, and by patterning by forming photoresist film not shown in the figure. Then, as shown in FIG. 3, after forming a coating layer 5 made of $SiO_2$, $Si_3N_4$ or the like on an entire surface by a method of CVD or the like, patterning is performed so as to expose only an end part of the interconnection 4 described above where the bump electrode is formed. In this case, the electrode pad 4a relocated, which is an exposed part of the interconnection 4 for a place of forming bump electrode, is formed to have a spacing between the electrode pads such that a pitch of the electrode pads is approximately 0.4 mm and a size of each of the electrode pads is approximately 150 μm Ø.

Next, as shown in FIG. 4, the back surface of the semiconductor substrate 1 is ground to a thickness of approximately 150 to 350 μm. Actually, the semiconductor substrate 1 having a thickness of 630 μm is ground to that of 200±15 μm.

Figure 5A:
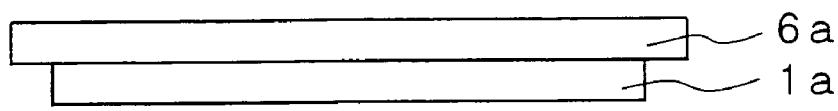
Figure 5B:
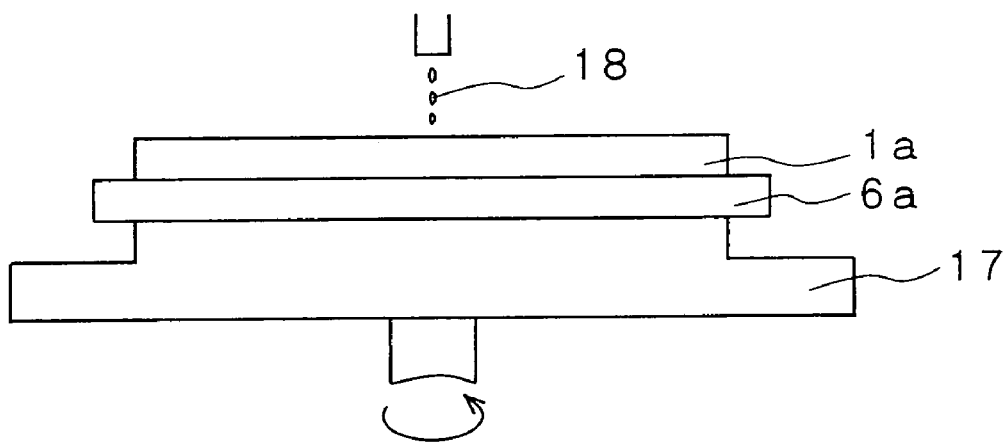
Figure 5C:
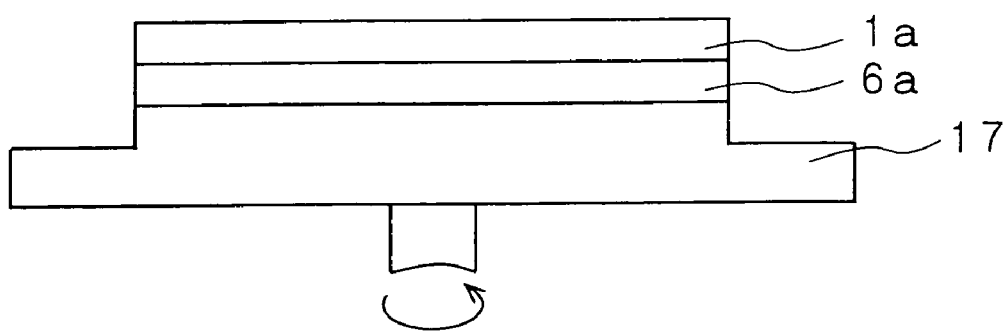

Next, as shown in FIG. 5, The first resin layer is stuck, which is produced by processing in sheet, for example, an epoxy resin containing filler material, on the back surface of the semiconductor substrate 1. The first resin layer 6 is formed having a thickness of, for example, approximately 50±10 μm on the entire back surface of the wafer. Concretely, for example, as shown in FIG. 5A, a resin sheet 6a, made of a material having a thickness of approximately 50±5 μm and soluble in organic solvent like acetone, and cut into a larger size than that of the semiconductor wafer 1a, is put on the back surface of the semiconductor wafer 1a which is the semiconductor substrate 1 of a wafer form, and stuck by heating at a temperature of, for example, approximately 70° C. And, as shown in FIG. 5B, while fixing a side of the resin sheet 6a on a spinner 17 and rotating it, the resin sheet hanging out of surroundings of the wafer 1a is solved and removed by dropping acetone from a side of the top surface of the wafer 1a, as shown in FIG. 5C. Thereafter, the first resin layer 6 having a thickness of approximately 50±10 μm can be obtained on the entire back surface of the wafer 1a, by curing the resin by a heat treatment, for example, at a temperature of approximately 120° C. and for approximately 8 hours, and by a subsequent heat treatment at a raised temperature of approximately 175° C. and for approximately 1.5 hours.

Next, as shown in FIG. 6, the barrier metal layer 7 is formed on the electrode pad 4a which is relocated. Actually, it has been performed as follows. At first, applying a degrease treatment in order to improve hydrophilization of a surface of the electro pad 4a which is relocated, thereafter, an oxide film formed on the surface is removed by sulfuric acid or nitric acid. After that, a Zn film is plated by a substitutional plating technique. After the Zn film is removed once by nitric acid, the Zn film is plated again by the substitutional plating technique, and the Zn film having a uniform thickness is formed on the surface of the electrode pad 4a. And next, a Ni film having a thickness of 5 to 9 μm is deposited by deoxidization reaction. Furthermore, in order to prevent oxidization of a surface of the Ni film, the barrier metal layer 7 is formed by forming an Au film having a thickness of 0.03 μm by the substitutional plating technique. And, a diameter of the barrier metal layer 7 is 160 μm. Here, an amount of etching the electrode pad 4a is large at plating a first Zn film by the substitutional plating technique. Actually, the amount of etching the electrode pad 4a was approximately 0.7 μm. Therefore, a thickness of the interconnection 4 should be provided approximately 1 μm or more. In case of the thickness less than 1 μm, material of the electrode pad 4a is consumed before forming the second Zn film, and there are occurrences not preferable such that the Ni film can not be formed.

Next, as shown in FIG. 7, the solder core 8 is formed on a surface of the barrier metal layer 7 by a printing technique. It has been found preferable to use a mask in which a ratio, (an area of an opening of the mask: $\pi r^2$)/(an area of a wall surface of the mask: $2\pi rt$)=$r/2t$, is larger than ½. When the ratio, (the area of the opening of the mask)/(the area of the wall surface of the mask), is smaller than ½, such that, for example, a diameter 2r of the opening of the mask is 250 μm and a thickness t of the mask is 200 μm, adhesion strength of the solder paste to the wall surface of the mask is large and the solder paste is left on the mask, and reproducibility of solder transcription is inferior. In a concrete example, by using the mask having a diameter of the opening of 250 μm and a thickness t of 100 μm, a solder paste made of Sn-Cu (Cu of 2 wt %) has been printed. And, reflowing the solder paste is performed by a heat treatment in an inert gas in which oxygen gas is included not more than 1,000 ppm, at a temperature of 260° C. and for 10 sec or more. It was verified that when the diameter of the opening was 250 μm and the thickness of the mask was varied, a solder paste could be transcribed at a thickness t not greater than 125 μm (r/2t=0.5). And when the concentration of the oxygen was 1,000 ppm or more, a variation in heights of the solder cores was recognized. When a diameter of the barrier metal layer was 160 μm, a diameter of the opening of the mask was 250 μm, and a thickness t of the mask was 100 μm, heights of the solder cores were ranged in a range of 130±20 μm.

Next, as shown in FIG. 8, the second resin layer 9 is formed on a side of a top surface of the semiconductor substrate 1 (the top surface is a surface of the exposed solder core 8) by coating an epoxy resin, containing a filler material, by a printing technique at an atmospheric pressure. Here, a mask having an opening which is formed at a region except a surrounding of the wafer is used for deciding a thickness of the second resin layer 9 when printing a resin, and a thickness of the mask for printing the resin should be a range from a height same as that of the solder core 8 to a height of about 150 μm thicker than it. After printing, bubbles taken in during printing are removed by leaving the wafer in a vacuum atmosphere. Thereafter, the resin is cured at a high temperature. Actually, when using a mask having a thickness of 250 μm which is larger than a height of the solder core, and made of a resin having a viscosity of 100 Pa·s, bubbles were exhausted leaving the wafer under a lowered pressure of 665 Pa for 20 minutes. Then, the resin was cured by a heat treatment at a temperature of 100° C. and for one hour, and subsequently at a temperature of 150° C. and for two hours. A thickness of the second resin layer 9 after curing was 250±50 μm. And, it was verified that the resin of the viscosity of 25, 200, 300 or 600 Pa·s could be used.

Next, as shown in FIG. 9, the solder core 8 is exposed by grinding the second resin layer 9 formed on a side of the top surface of the semiconductor substrate 1. An amount of grinding the resin is set such that a height of a ground surface of the resin 9 is from ⅔ to ½ of the height of the solder core 8. Actually, in case of the solder core 8 having a height of 130 μm, grinding was performed to a thickness of the second resin layer (a height of the solder core 8 after grinding) of 70 to 90 (80±10) μm. In this case, a diameter of the solder core 8 was in a range of 150±20 μm.

Next, as shown in FIG. 10, the solder bump 10 is formed on the solder core 8 by a printing technique. Here, it has been found preferable, in the same manner of a case forming the solder core 8, that a mask used for printing solder paste has a ratio, (an area of an opening of the mask)/(an area of a wall surface of the mask), not less than ½. The solder bump is reflowed by a heat treatment operated at a temperature of 260° C., for 10 sec and in an inertgas in which an oxygen concentration is not greater than 1,000 ppm. Actually, printing was performed by using a mask having openings of a diameter of 250 μm and a thickness of 100 μm, and a solder paste made of Sn—Cu (Cu of 2 wt %). when the thickness of the mask was varied, fixing the diameter of the opening of the mask for printing solder at 250 μm, it was confirmed that, the solder paste could be transcribed in a case of the thickness not greater than 125 μm, but the solder paste was left on the mask and reproducibility of the transcription was inferior in a case of the thickness of 150 μm. In addition, a variation in heights of the solder bumps 10 was recognized in case that the oxygen concentration in reflowing was not less than 1,000 ppm. When a diameter of the solder core 8 was in a range of 150±20 μm, a diameter of the opening of the mask was 250 μm, and a thickness t of the mask was 100 μm, heights of the solder bumps were ranged in a range of 120±30 μm.

Figure 11:
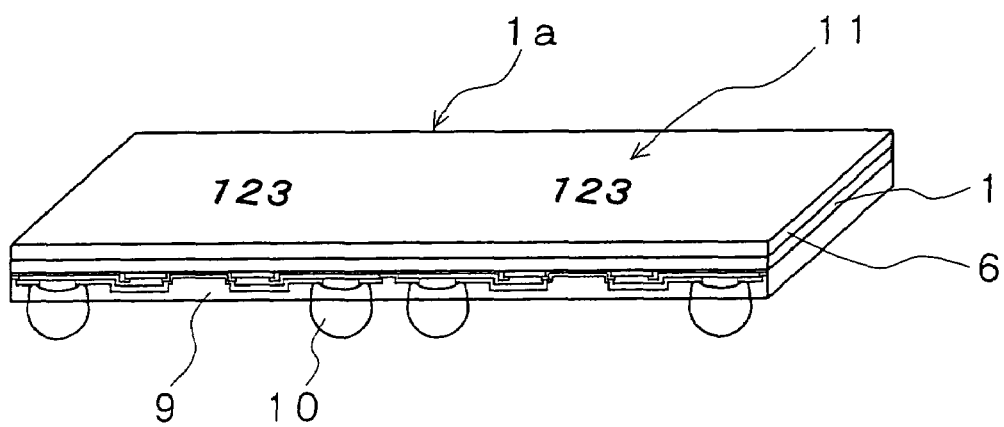
FIG. 11 is an explanatory view showing a manufacturing process of the embodiment of the manufacturing method according to the present invention.

Next, as shown by a number 123 in FIG. 11, a mark 11 like a type number or the like is marked on a back surface of a wafer 1a (two chips are shown in FIG. 11), that is, on an exposed surface of the first resin layer 6. This marking is performed by a printing or a carving by laser.

Figure 12:
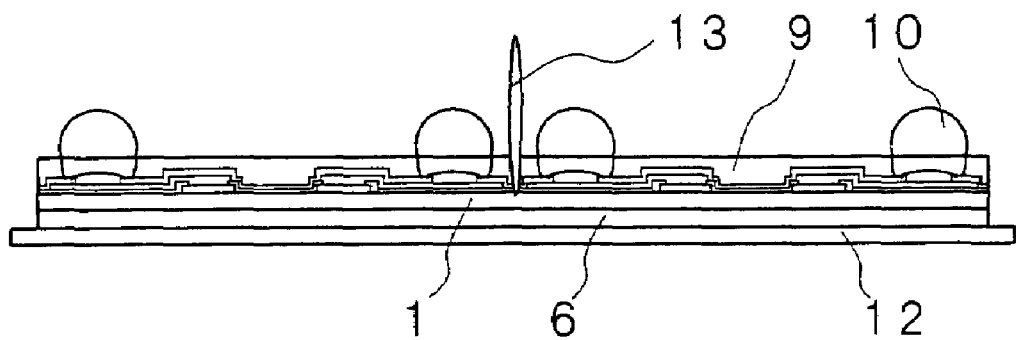
FIG. 12 is an explanatory view showing a manufacturing process of the embodiment of the manufacturing method according to the present invention.

Next, as shown in FIG. 12, same electronic circuits formed a lot on the wafer are scribed at their borders into chips (separating pieces). Actually, the back surface of the wafer is stuck to a dicing tape 12, and parts between chips are cut by saw 13. After cutting, chips, which are still stuck to the dicing tape 12, can be tested in a next process as it is.

Figure 13:
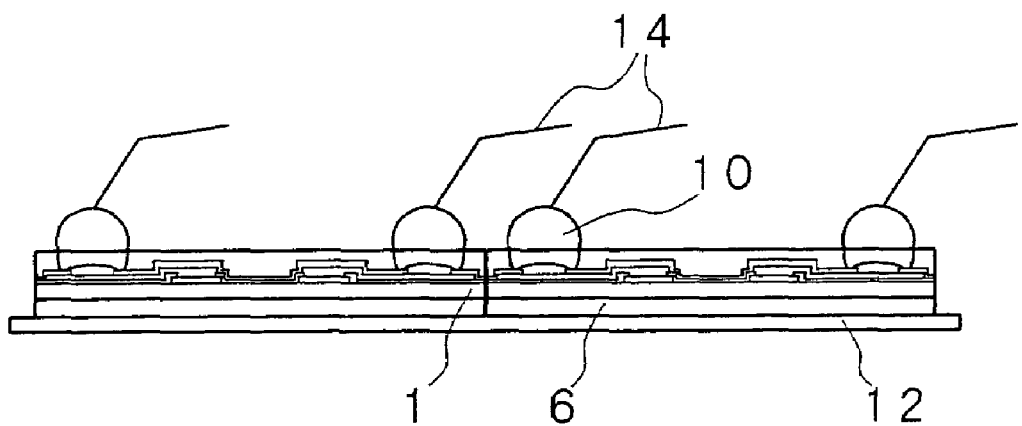
FIG. 13 is an explanatory view showing a manufacturing process of the embodiment of the manufacturing method according to the present invention.

Thereafter, as shown in FIG. 13, electric test is performed by contacting a probe 14 of a tester to the solder bump 10. By testing in this manner just before packing, reliability can be promoted, since defects occurred during scribing can be detected and prevented from shipping. By testing chips still stuck on the dicing tape, as chips are arranged in a line and row on the dicing tape 12 while being electrically separated, two or more chips can be tested in a lump. Actually, four chips were tested in a lump. Since a plurality of chips can be tested in a lump like this, an index of test can be shortened and a cost of test has been reduced. Of course, a usual manner of testing every one chip independently like picking and pressing can be employed.

Figure 14:
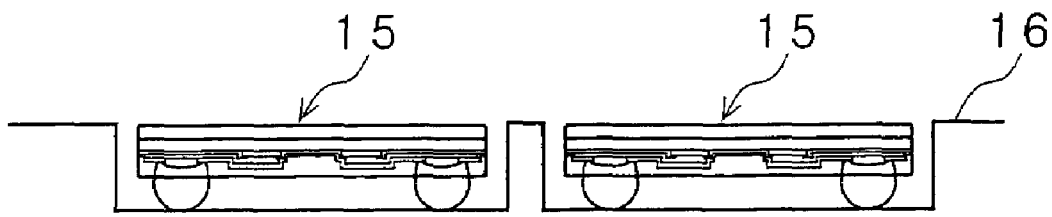
FIG. 14 is an explanatory view showing a manufacturing process of the embodiment of the manufacturing method according to the present invention.
Figure 15:
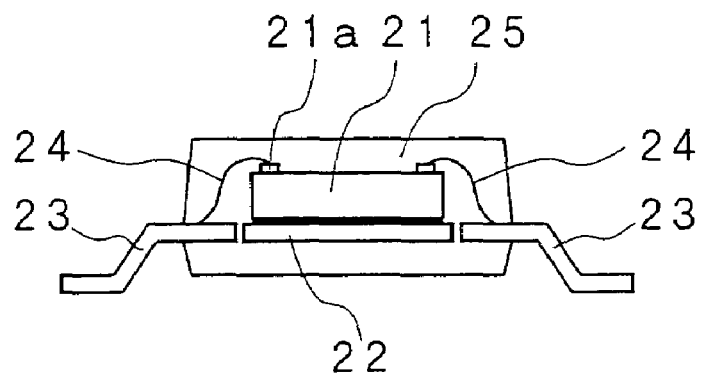
FIG. 15 is an explanatory view showing an example of a structure in a semiconductor device by the prior art.
Figure 16:
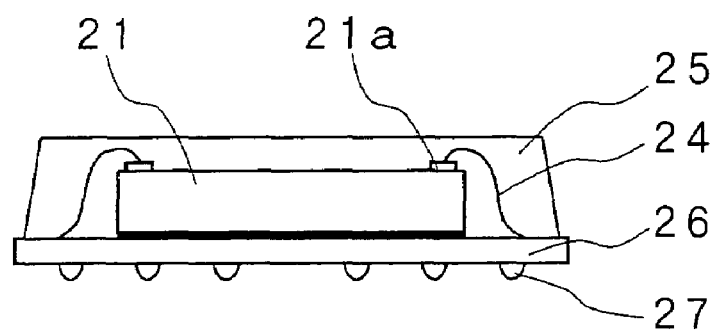
FIG. 16 is an explanatory view showing an example of a structure in a semiconductor device by the prior art.
Figure 17:
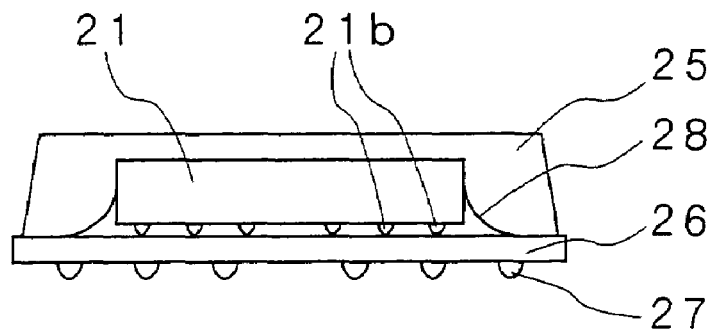
FIG. 17 is an explanatory view showing an example of a structure in a semiconductor device by the prior art.

At last, after inspecting appearance, a completed semiconductor device 15 separated from the dicing tape, as shown in FIG. 14, is restored in a recess of a carrier tape 16 in which recesses are formed for restoring chips one by one, and can be ready to ship by packing the carrier tape 16.

As explained above, according to the present invention, since the spacing between electrode pads is expanded by relocating electrode terminals by applying the wafer process to the surface of the semiconductor substrate, there can be obtained the semiconductor device which can be mounted directly on a mother board without using an interposer and which has a significantly small size. Furthermore, after forming the first resin layer 1 on the back surface, ground and thinned, of the semiconductor substrate, and before forming the solder core and the solder bump on the surface of the semiconductor substrate, the barrier metal layer is formed by the electroless plating technique and thereafter, the solder core and the solder bump are formed by printing and heating. Therefore, damage and fracture in a manufacturing process can be easily prevented, it is not necessary to make a mask specially due to the electroless plating and manufacturing can be performed with very simple equipment, and with treating in a lump by a unit of a wafer. As a result, a downsized, thinned and weight lightened semiconductor device having nearly same size as that of a chip, which can be mounted directly on the mother board, can be obtained with a very low cost. Furthermore, since the first resin sheet is formed by sticking a resin sheet, thinning of a thickness and sever clearance of size becomes capable and, as a result, a thin semiconductor device with a highly accurate dimension can be obtained.

Although, the concrete example described above is a case such that Al—Si (Si of 1 wt %) is employed as the interconnection 4 for relocating electrode terminals, a vacuum evaporation technique may be employed in stead of the sputtering technique for forming an interconnection layer in case of using Au or Cu as the interconnection 4. And, the barrier metal layer 7 shown in FIG. 6 can be formed by a following process, too.

At first, in the same manner as in the example described above, the surface of the electrode pad 4a relocated is degreased in order to improve its hydrophilization, and subsequently, oxide film formed on the surface is removed by sulfuric acid or nitric acid. After that, a Pd film is plated on the surface of the electrode pad 4a by a substitutional plating technique. And next, a Ni film having a thickness of 5 to 9 μm is plated by deoxidization reaction. Thereafter, a barrier metal layer 7 is formed by forming an Au film having a thickness of 0.03 μm by the substitutional plating technique. A diameter of the barrier metal layer 7 is 160 μm. Here, a thickness of the interconnection 4 should be approximately 1 μm or more, because a break of interconnection may be caused by unevenness on the surface of the semiconductor substrate 1.

INDUSTRIAL APPLICABILITY

The semiconductor device according to the present invention can be used for kinds of electronic devices, in which light weight, thin thickness and small size are demanded, such as a portable device like a portable telephone or the like, CD, DVD, a note type personal computer or the like.

What is claimed is:

1. A method for manufacturing a semiconductor device comprising the steps of:
   (a) forming an electronic circuit on one surface of a semiconductor substrate and forming electrode pads by disposing electrode terminals of the electronic circuit through interconnections on said one surface of the semiconductor substrate;
   (b) grinding a back surface which is a surface of the semiconductor substrate opposite said one surface;
   (c) forming a first resin layer on the back surface of the semiconductor substrate;
   (d) forming a barrier metal layer on each of the electrode pads by an electroless plating technique after forming the first resin layer;
   (e) forming a solder core on the barrier metal layer by printing a solder paste and heating;
   (f) forming a second resin layer on a surface of the semiconductor substrate on which the solder core is formed;
   (g) exposing the solder core by grinding the second resin layer; and
   (h) forming a solder bump by printing a solder paste on an exposed surface of the solder core, and by applying a heat treatment.

2. The method for manufacturing the semiconductor device according to claim 1, wherein the step (c) comprises the steps of:
   sticking a resin sheet on the back surface of the semiconductor substrate, and
   curing the resin sheet.

3. The method for manufacturing the semiconductor device according to claim 1, wherein the step (c) comprises the steps of:
   sticking a resin sheet on the back surface of the semiconductor substrate, the resin sheet being made of a resin soluble in organic solvents and having a size larger than that of the semiconductor substrate,
   removing a part of the resin sheet, which is not adhere to the semiconductor substrate, by solving the part with an organic solvent which drops from a top surface of the semiconductor substrate by rotating the substrate, and thereby sticking the resin sheet on the back surface of the semiconductor substrate entirely; and
   curing the resin sheet.

* * * * *